United States Patent
Moser et al.

(10) Patent No.: US 8,803,579 B2
(45) Date of Patent: Aug. 12, 2014

(54) DIGITALLY CONTROLLED PULSE WIDTH MODULATOR UTILIZING REAL TIME CALIBRATION

(75) Inventors: David D. Moser, Haymarket, VA (US); Daniel M. Pirkl, Centreville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/606,112

(22) Filed: Sep. 7, 2012

(65) Prior Publication Data

US 2013/0076420 A1     Mar. 28, 2013

Related U.S. Application Data

(60) Provisional application No. 61/532,204, filed on Sep. 8, 2011.

(51) Int. Cl.
*H03K 7/08* (2006.01)
*H03K 3/017* (2006.01)

(52) U.S. Cl.
CPC . *H03K 3/017* (2013.01); *H03K 7/08* (2013.01)
USPC .......................................... 327/175; 375/238

(58) Field of Classification Search
CPC ..... H03K 19/00361; H03K 5/12; H03K 5/01; H03K 5/06; H03K 5/156; H03K 5/04; H03K 5/07; H03K 5/05; H03K 5/1565; H03K 7/08; H03K 3/284; H03K 3/017
USPC ................... 327/170–176, 159, 160; 375/238
See application file for complete search history.

(56) References Cited

U.S. PATENT DOCUMENTS

| | | | | |
|---|---|---|---|---|
| 5,075,566 | A | * | 12/1991 | Chuang et al. ................. 327/411 |
| 5,465,076 | A | * | 11/1995 | Yamauchi et al. ............. 331/179 |
| 7,157,948 | B2 | * | 1/2007 | McClannahan et al. ...... 327/151 |
| 7,206,343 | B2 | * | 4/2007 | Pearce .......................... 375/238 |
| 7,355,462 | B1 | * | 4/2008 | Wong et al. ................... 327/156 |
| 2006/0022732 | A1 | * | 2/2006 | Leung et al. .................. 327/172 |
| 2008/0007311 | A1 | * | 1/2008 | Choi ............................. 327/156 |

* cited by examiner

*Primary Examiner* — Lincoln Donovan
*Assistant Examiner* — Thomas Skibinski
(74) *Attorney, Agent, or Firm* — Daniel J. Long (57) ABSTRACT

A system and method for controlling pulse width for electronic devices in real time is disclosed. The system includes a Digital Pulse Width Modulator (DPWM), a real time calibration circuit and a delay line circuit. The real time calibration circuit is configured to ensure proper fractional delay is applied to yield correct duty cycle of the DPWM. The delay line circuit comprising a multiplexer delay line with built in decoders, modulates the pulse width for fractional clock cycle delay.

4 Claims, 9 Drawing Sheets

DIGITALLY CONTROLLED PULSE WIDTH MODULATOR UTILIZING REAL TIME CALIBRATION

STATEMENT OF GOVERNMENT INTEREST

The invention was made with United States Government assistance under contract no. 08-C-0295, CLIN 0002 awarded by the Department of Defense National Reconnaissance Office. The United States Government has certain rights in the invention.

CROSS-REFERENCE TO RELATED APPLICATIONS

This Application claims rights under 35 USC §119(e) from U.S. Application Ser. No. 61/532,204 filed Sep. 8, 2011, the contents of which are incorporated herein by reference.

TECHNICAL FIELD

Embodiments are generally related to Pulse Width Modulators (PWM). Embodiments are particularly related to Digital Pulse Width Modulator (DPWM) for controlling pulse width in electronic devices. Embodiments are additionally related to digital pulse width modulators with continuous real time calibration.

BACKGROUND OF THE INVENTION

Power management, to improve the power efficiency of Micro Processing Unit (MPUs), Field Programmable Gate Array (FPGAs) and Digital Signal Processor (DSPs) and the like, has become a vital element in digital system design. The power management system includes a full operation mode, standby mode, and sleep mode. The clock frequency, core voltage and/or core current are changed in each mode accordingly. As a result, the output current of the Point-Of-Load (POL) DC-DC converters is intermittent and has a high slew rate. A low output voltage, a large output current and a high speed response are required for the POL. In such a condition, control circuits with high accuracy and high-speed are required as the tolerance of the output voltage becomes internally severe for speed and lower voltage of the Micro Processor Units (MPUs), Field Programmable Gate Arrays (FPGAs) and Digital Signal Processors (DSPs). A general control method is pulse width modulation (PWM) control with Proportional Integral Derivative (PID). Generally, such control circuits are composed with analog circuits and/or simple combination digital circuits.

Robustness or flexible controls for versatile conditions are demanded which cannot be accomplished with analog control circuits. For the control purpose, DPWM control is a one of appropriate technique. Also current analog comparator methods for pulse width modulation are not programmable and may not be calibrated.

DPWM have technical limitations mainly associated with delay related with the sampling process and discrete-time computation. There is generally a tradeoff between the sampling and computation frequency, and the controller power use. Thus, it is beneficial to develop specialized analog-to-digital converter (ADC) architectures which can meet the voltage regulation requirements without excessive power consumption. Importantly, applications requiring very high speed of response (of order of 100 ns) tend to be high-power applications such as servers, where the power overhead of a fast, high-resolution ADC's is negligible.

DPWM requires high resolution to produce tightly regulated output voltages, and for elimination of undesirable limit-cycle oscillations of output voltage and inductor current, thus may not be able to provide real time calibration.

A need therefore exists for a high resolution DPWM with continuous real time calibration.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for Pulse Width Modulators (PWM).

It is another aspect of the disclosed embodiments to provide Digital Pulse Width Modulator (DPWM) for controlling pulse width in electronic devices.

It is a further aspect of the disclosed embodiments to provide digital pulse width modulators with continuous real time calibration.

It is another aspect of the disclosed embodiments to provide a low power digitally controlled pulse modulator that utilizes various sized delay lines and allows digital filtering and programmable resolution.

It is yet, another aspect of the disclosed embodiments to provide a digitally controlled pulse modulator that performs digital pulse width modulation with real time calibration to compensate environmental variations due to radiation, aging, temperature, and voltage changes.

The aforementioned aspects and other objectives and advantages can now be achieved as described herein. A system and method for controlling pulse width for electronic devices in real time is disclosed. The system includes a Digital Pulse Width Modulator (DPWM), a real time calibration circuit and a delay line circuit. The real time calibration circuit is configured to ensure proper fractional delay is applied to yield correct duty cycle of the DPWM. The delay line circuit modulates the pulse width for fractional clock cycle delay. The delay line circuit comprises a multiplexer delay line with built in decoders.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and, together with the detailed description of the invention, serve to explain the principles of the disclosed embodiments.

DETAILED DESCRIPTION

The particular values and configurations discussed in these non-limiting examples can be varied and are cited merely to illustrate at least one embodiment and are not intended to limit the scope thereof.

Figure 1:
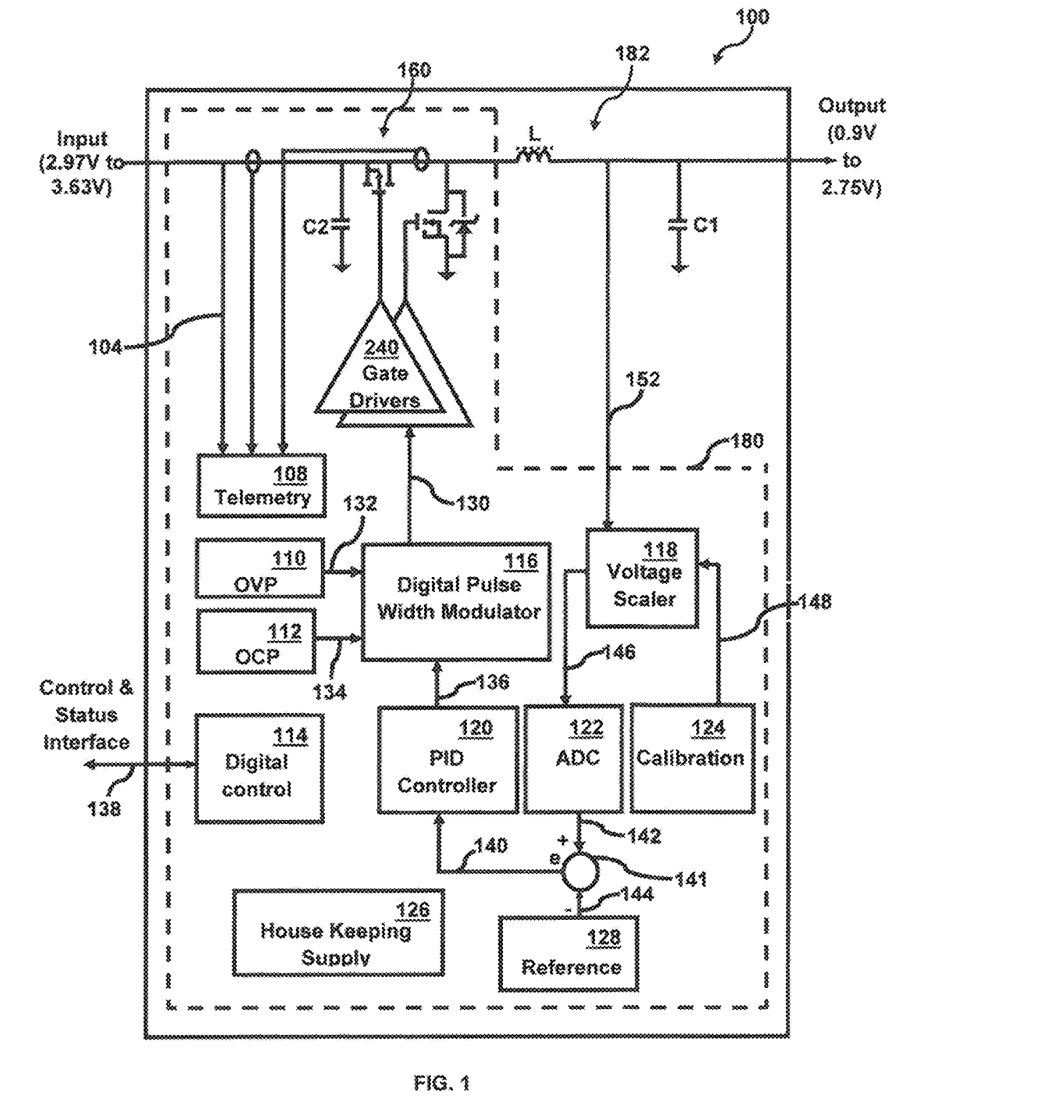
FIG. 1 illustrates a schematic diagram of a DPWM connected to gate drivers, in accordance with the disclosed embodiments.

Referring to FIG. 1, a schematic diagram of a DPWM system 100 connected to gate drivers 240 is disclosed. The input voltage 104 in the range of 2.97 Volts to 3.6 Volts is applied to a power MOSFET 160. The input voltage 104 is monitored by utilizing a telemetry unit 108. The power MOSFET 160 is driven by the gate drivers 240 which are controlled by a DPWM 116. The DPWM 116 receives control signals 132 and 134 from Over Voltage Protection (OVP) circuit 110 and Over Current Protection (OCP) circuit 112.

A voltage scaler 118 receives the output voltage 152 and generates a voltage 146 depending on the signal 148 from a calibration unit 124. The voltage 146 is converted to a digital signal 142 by utilizing an Analog to Digital Converter (ADC) 122. The digital signal 142 from ADC 122 and reference signal 144 from reference circuit 128 are compared in a comparator 141. The error signal 140 is given to Proportional Integral Derivative (PID) controller 120 to generate a control signal 136 for the DPWM 116. The DPWM 116 generates a duty cycle pulse 130 based on the control signal 136 which drives the gate drivers 240. The DPWM 116 provides dead time control between the high-side and low-side of the device for the internal gate driver 240 with power MOSFET 160. The dead time control can also be provided to an external gate driver and FETs. The digital control unit 114 provides necessary control and status signal 138 to various devices in Point of Common Coupling (PCC) 180. The house keeping supply 126 provide necessary voltage to reference circuit 128. Point-Of-Load (POL) 182 is shown.

Figure 2:
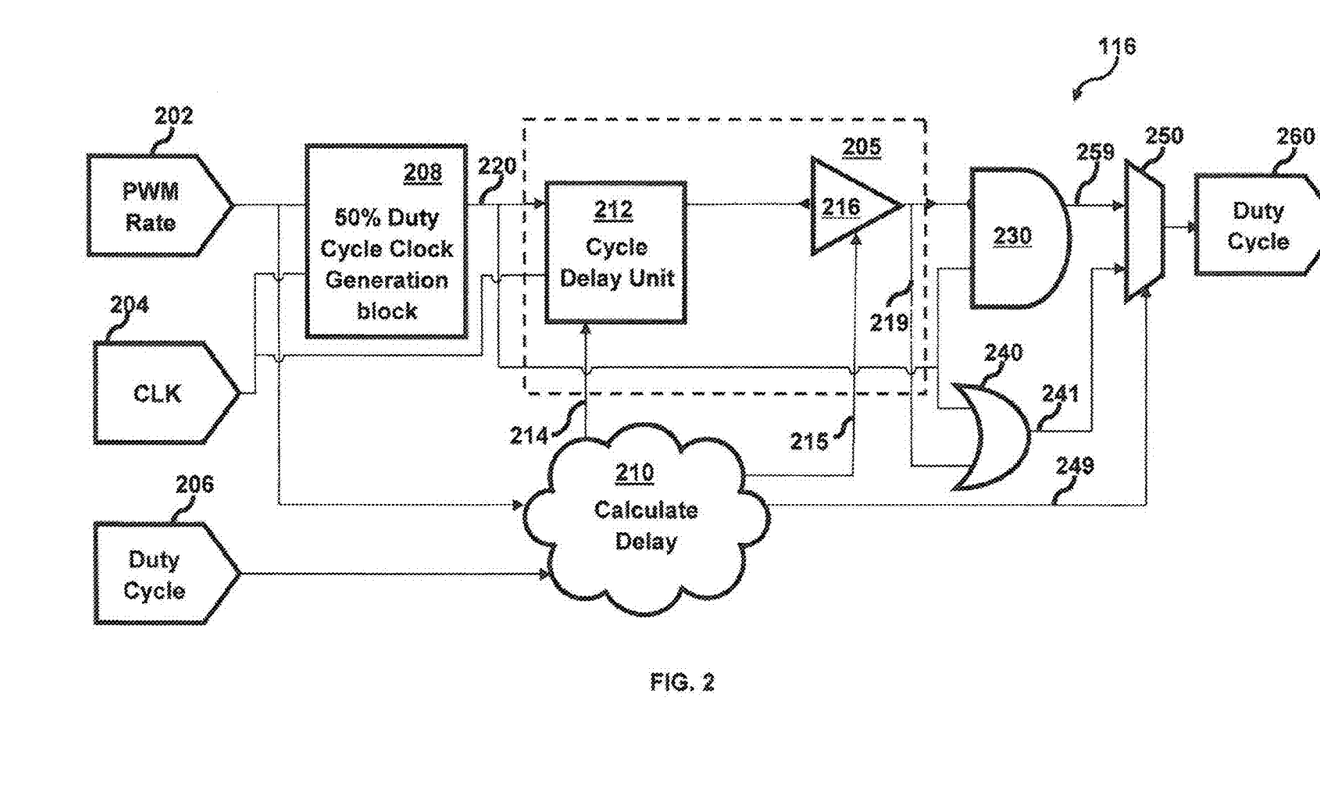
FIG. 2 illustrates a top level block diagram of the DPWM without phase delay circuitry depicted in FIG. 1, in accordance with the disclosed embodiments.

Referring to FIG. 2, a top level block diagram of the DPWM 116 is shown. Fifty percent duty cycle clock 220 is generated by fifty percent duty cycle clock generation block 208 by utilizing PWM rate 202 and clock 204, such that the period of the fifty percent duty cycle clock 220 is multiples of twice the period of clock 204. A delay is calculated based on duty cycle 206 by utilizing a delay calculator 210. The delay calculation is based on the desired duty cycle and decision on how much to delay the fifty percent clock 220, Delay block 205 consists of a cycle delay unit 212 which provides delay for the amount of clock periods and fractional delay unit 216 which provides delay for the amount of fractions of clock period. The fifty percent duty cycle clock 220 is fed to delay block 205 and fed directly without delay to "OR" gate 240 as well to "AND" gate 230. Delay information 214 from delay calculator 210 is fed to cycle delay unit 212. Fractional delay calculation 215 from delay calculator 210 is fed to fractional delay unit 216. The output 219 of delay block 205 is fed to "AND" gate 230 as well to "OR" gate 240. The output 259 of "AND" gate 230 and output 241 of "OR" gate 240 is fed to multiplexer unit 250. Based on the information 249 from delay calculator 210, if desired duty cycle is greater than fifty percent signal, then output path 241 is selected, otherwise output path 259 is selected by the multiplexer unit 250. The output of multiplexer unit 250 is desired duty out 260 with coarse delay or fine delay depending on output path selected.

Figure 3A:
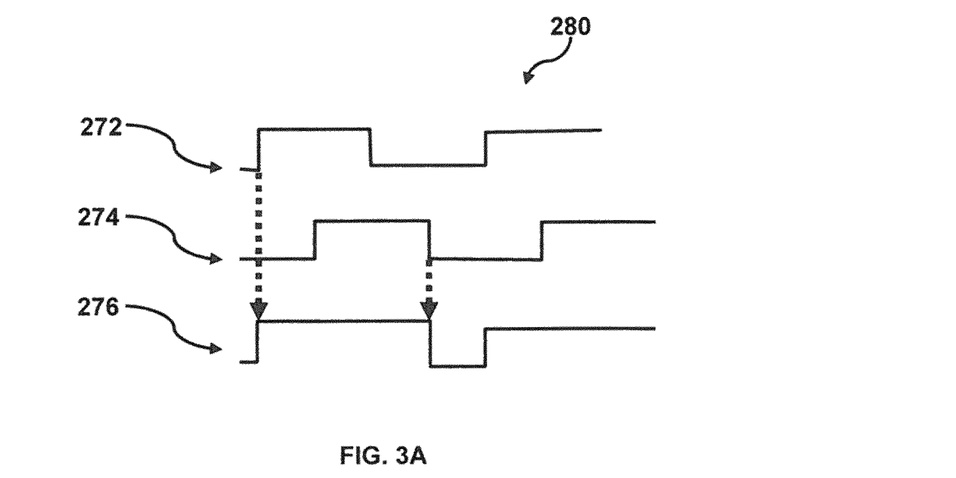
FIGS. 3A-3B illustrate timing diagrams of signals utilized in FIG. 2, showing the duty cycle output for given input clock, pulse width modulator frequency, and duty cycle value, in accordance with the disclosed embodiments.
Figure 3B:
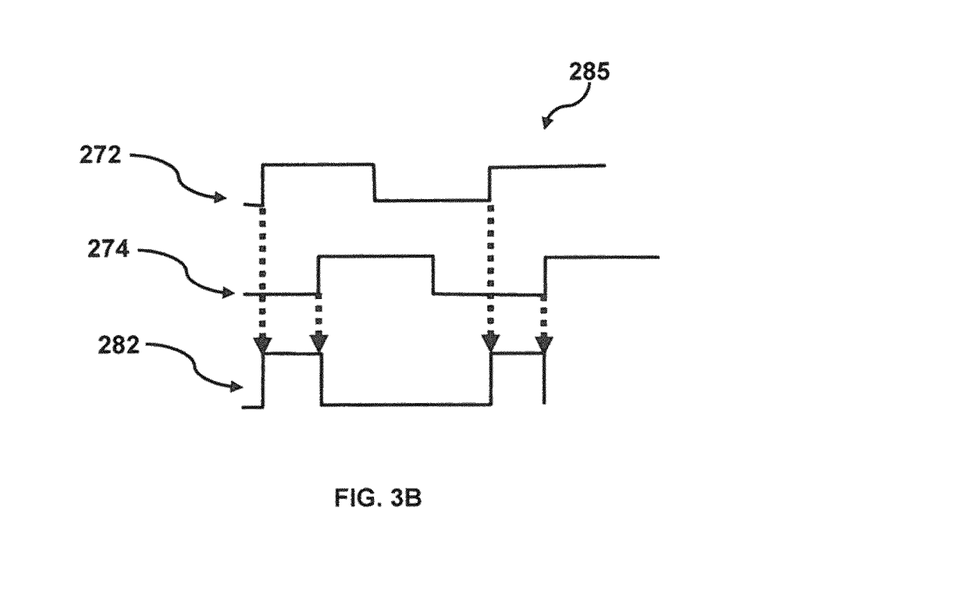

Referring to FIGS. 3A-3B, timing diagrams 280 and 285 for duty cycle greater than fifty percent and less than fifty percent are shown. For duty cycle greater than fifty percent, the graphs 272, 274 and 276 represents the timing diagrams of the outputs 220, 219 and 260 depicted in FIG. 2. For duty cycle less than fifty percent, the graphs 272, 274 and 282 represents the timing diagrams of the signals 220, 219 and 260 depicted in FIG. 2.

Figure 4:
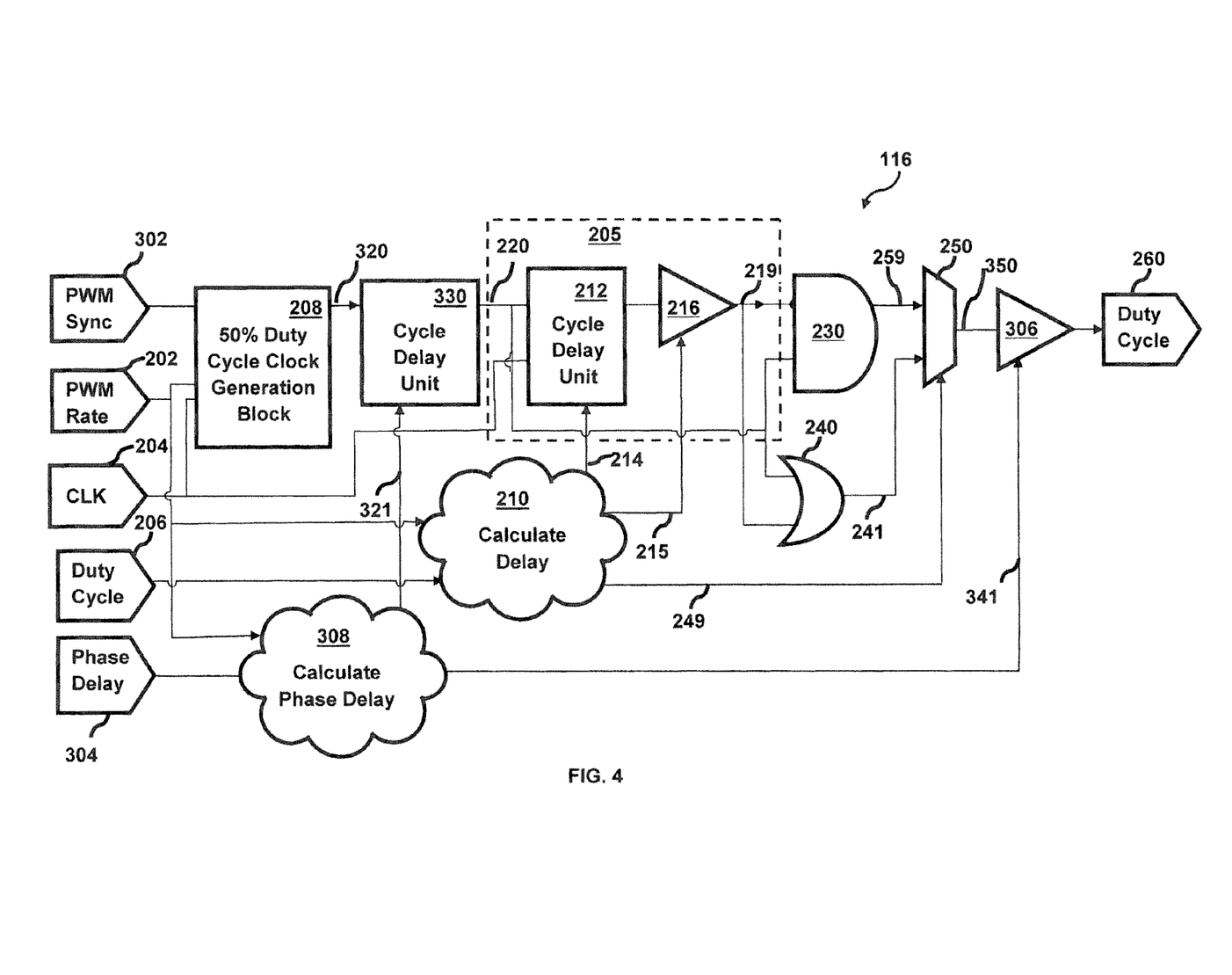
FIG. 4 illustrates a second top level block diagram of the DPWM with phase delay circuitry depicted in FIG. 1, in accordance with the disclosed embodiments.

Referring to FIG. 4, a second top level block diagram of the DPWM 116 is shown. The block diagram is with cycle delay unit 330 in addition to the delay elements referred in FIG. 2. For generation of Fifty percent duty cycle clock 320, in addition to the PWM rate 202 and clock 204, PWM synchronization signal 302 which specifies beginning of PWM cycle is also provided and generated fifty percent duty cycle clock 320 is fed to cycle delay unit 330. Using PWM rate 202 and reference phase delay 304, amount by which phase of PWM output to be delayed is calculated by phase delay calculator 308. The cycle delay unit 330 is used to provide phase delay of cycle portion to the fifty percent duty cycle clock 320 by utilizing phase delay calculation 321 obtained from phase delay calculator 308. The information 341 from phase delay calculator 308 is also utilized for providing percentage of cycle portion phase delay 306 to the selected output 350 of multiplexer 250.

Figure 5:
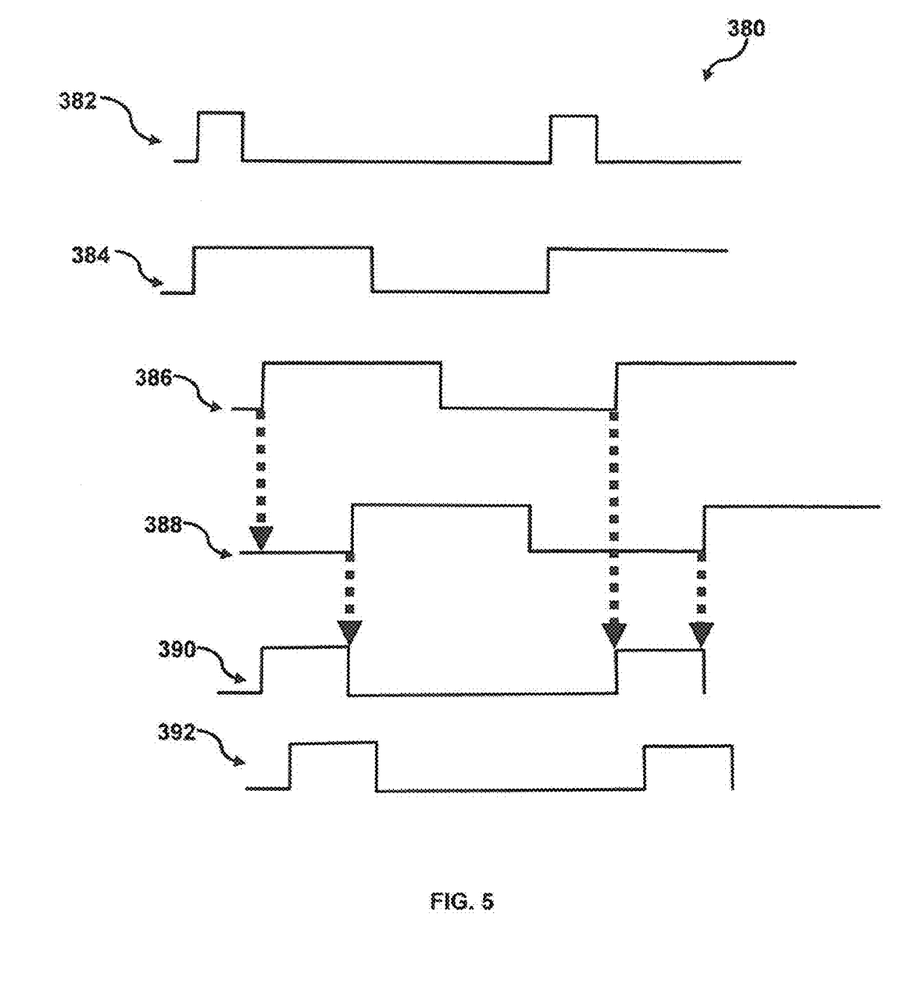
FIG. 5 illustrates timing diagram of signals utilized in FIG. 4 showing the duty cycle output for given input clock, pulse width modulator frequency, and duty cycle value, in accordance with the disclosed embodiments.

Referring to FIG. 5, the timing diagram 380 for duty cycle less than fifty percent is shown. For duty cycle less than fifty percent, the graphs 382, 384, 386, 388, 390 and 392 represents the timing diagrams of the signals 302, 320, 220, 219, 350 and 260 depicted in FIG. 4.

Figure 6:
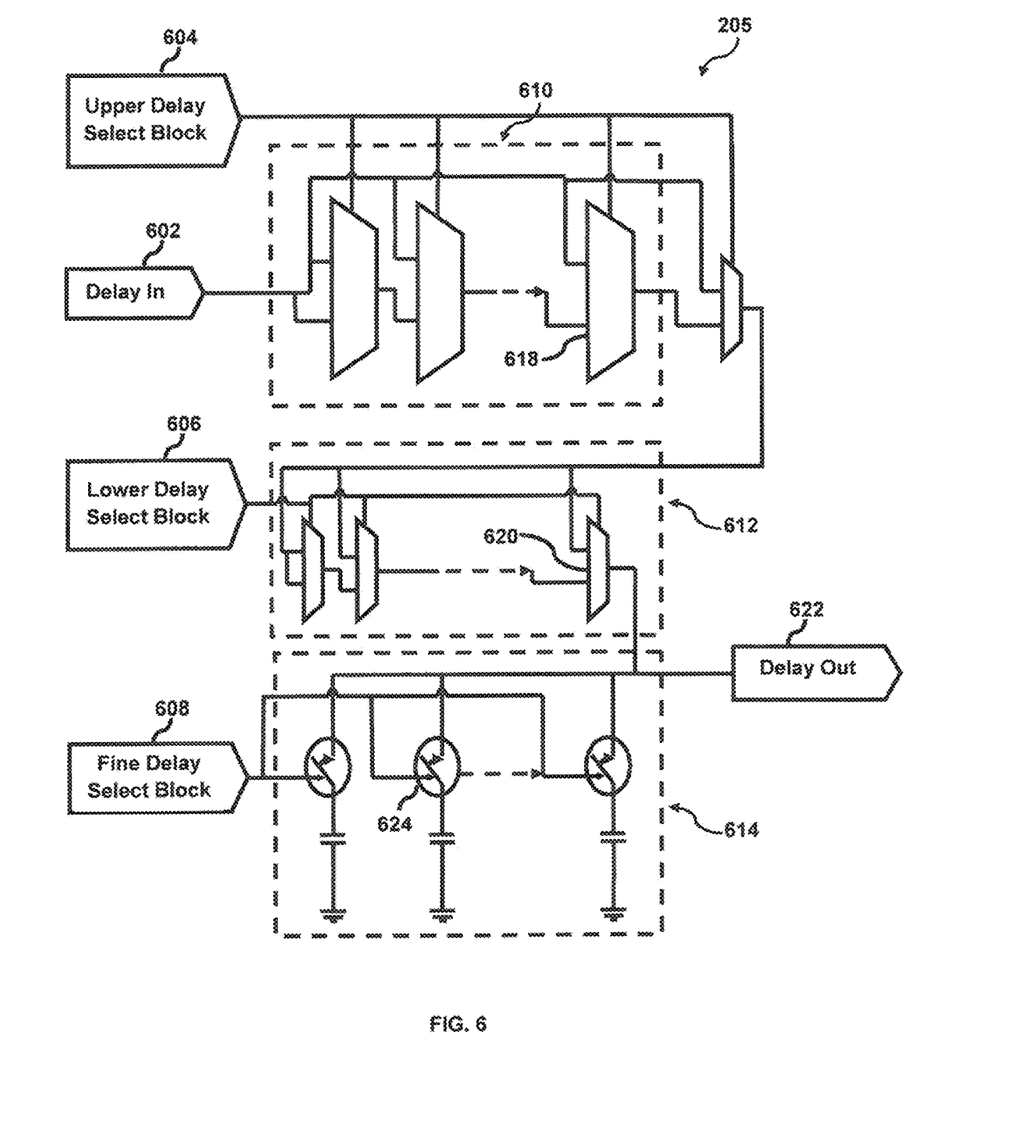
FIG. 6 illustrates a block diagram of a programmable high resolution delay line circuit depicted in FIG. 2 and FIG. 4, in accordance with the disclosed embodiments.
Figure 7:
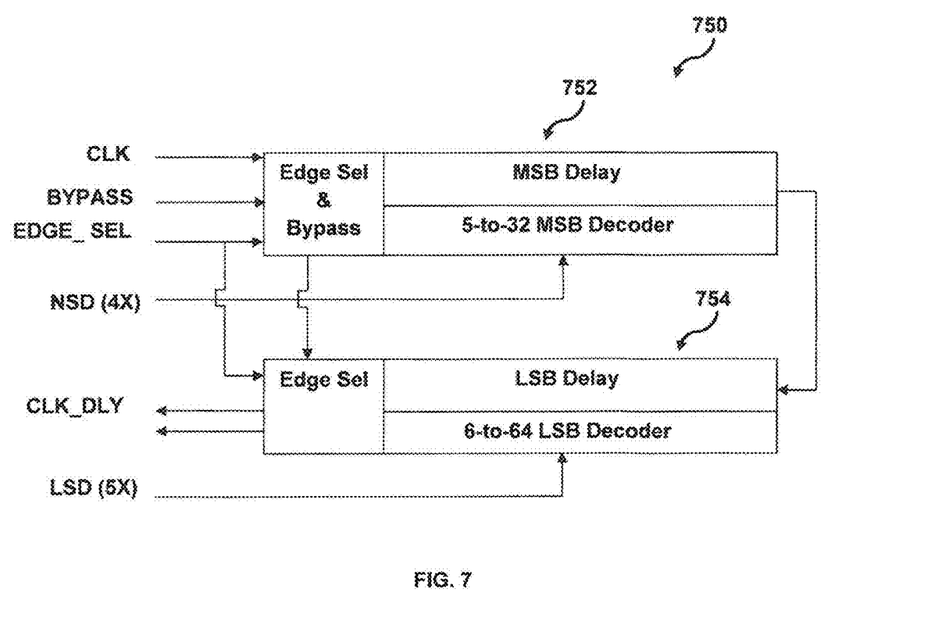
FIG. 7 illustrates a schematic diagram of delay lines with MSB and LSB decoders, in accordance with the disclosed embodiments.

Referring to FIGS. 6-7, the programmable high resolution delay line circuit of FIGS. 2 and 4 is shown. The programmable high resolution delay line circuit is also referred as the delay block 205 in FIGS. 2 and 4. Fifty percent duty cycle clock output 220 is given as input 602 to a delay block 205 depicted in FIG. 2 which provides delay out 622. Fifty percent duty cycle clock output 320 after phase delay is given as input 602 to a delay block 205 depicted in FIG. 4 which provides delay out 622. The delay block 205 allows for the modulation of the pulse width for fractional clock cycle delay. For larger delay, the upper delay section 610 is selected by utilizing upper delay select block 604. For medium delay, the lower delay section 612 is selected by utilizing lower delay select block 606. For very fine resolution delay, the fine delay section 614 is selected by utilizing fine delay select block 608. The upper delay section 610 comprises of multiplexers 618, each of them typically provides delay in order of one nano seconds. The lower delay section 612 comprises of multiplexers 620, each of them typically provides delay in order of 100 pica seconds. The fine delay section 614 comprises of transistor switches 624, each of them typically provides fine amount of delay. FIG. 7 shows a schematic block diagram of a set of multiplexer delay lines 750 with built in Most Significant Bit) MSB and (Least Significant Bit) LSB decoders 752 and 754.

Figure 8:
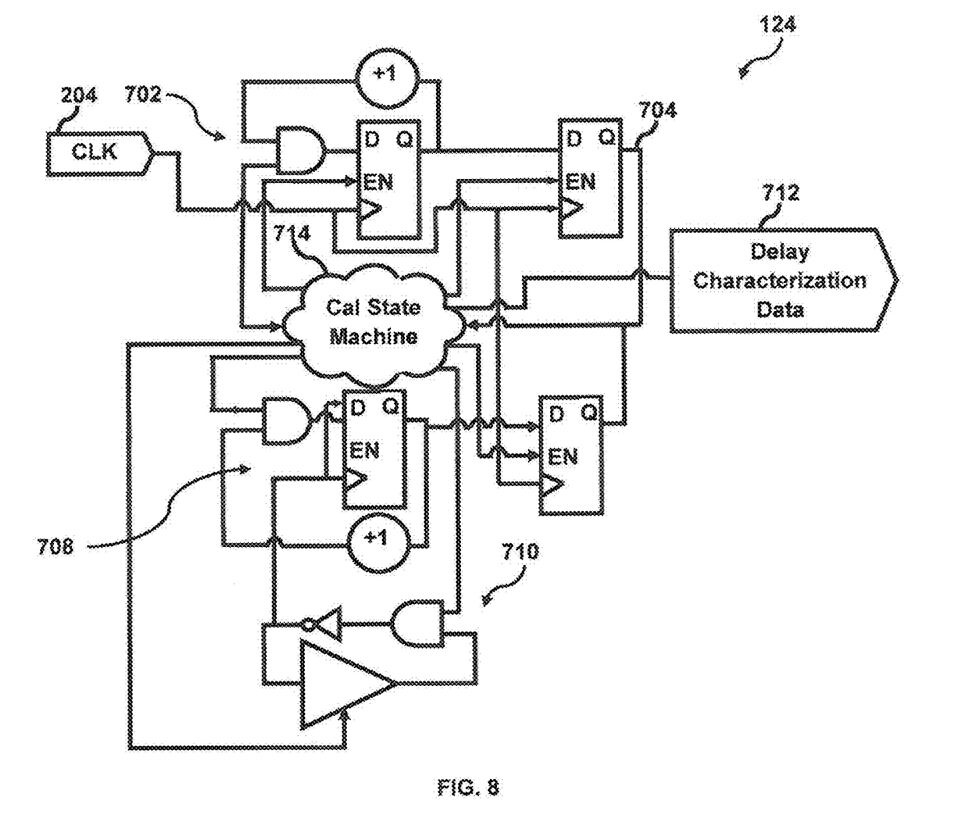
FIG. 8 illustrates a block diagram of a real time calibration unit, accordance with the disclosed embodiment.

Referring to FIG. 8, a real time calibration unit 124 depicted in FIG. 1 is shown. A reset counter 702 is utilized to count the system clock 204 to generate a reference time 704. The reference time 704 is fed to a state machine calculator 714. The ring oscillator 710 generates a clock signal based on the reference time 704 and compares the generated clock with the system clock 204. The compared clock is counted by utilizing a counter 708 which is fed to the state machine calculator 714. The state machine calculator 714 determines delay characterization data 712 by running a ring oscillator 710 with different delays. The delay characterization data 712 is used as unit delays in DPWM. This delay chain calibration used to ensure that proper fractional delay is applied to yield correct duty cycle of the output of the Digital Pulse Width Modulator.

Figure 9:
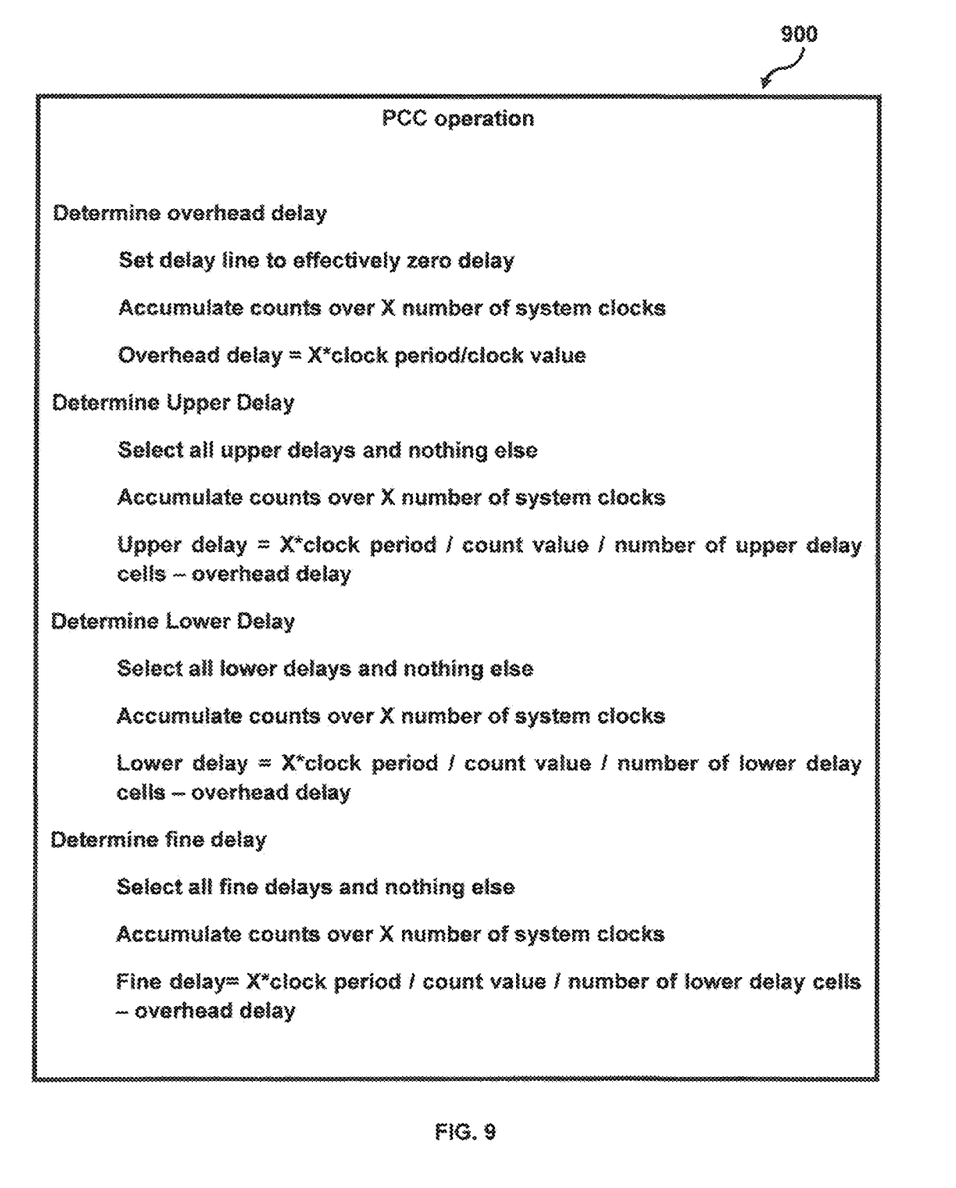
FIG. 9 illustrates delay chain calibration algorithm, in accordance with the disclosed embodiments.

Referring to FIG. 9 a delay chain calibration algorithm 800 is shown. The algorithm selects appropriate delay code for necessary delay. Also the algorithm ensures that at real time, the device corrects for any given voltage, temperature, radiation, and aging conditions. Delay line is used as oscillator and calibration is performed in background/parallel with normal POC PCC operation.

The algorithm is used in conjunction with the existing circuitry and the fractional high precision delay line to calibrate the delay line across the environmental conditions so that proper delay is applied to the pulse output. Without this real-time calibration, the fractional delay would vary with temperature, voltage, radiation, and aging conditions.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A system for controlling pulse width for electronic devices in real time comprising:
    a delay line circuit comprising a fractional clock delay line, wherein said fractional clock delay line comprises a plurality of selectable delay length elements; and
    a digital real time calibration circuit utilizing a counter configured for counting a compared clock, wherein the compared clock is employed to determine delay characterization data for continually calibrating said fractional clock delay line for obtaining proper fractional delay, wherein a state machine calculator is configured to determine the delay characterization data by running a ring oscillator with different delays and
    a digitally controlled pulse width modulator for generating a pulse width modulation pulse based on the fractional clock delay line.

2. The system of claim 1, wherein said plurality of selectable delay length elements is but of:
    a plurality of long delay multiplexers for providing upper delay;
    a plurality of small delay multiplexers for providing lower delay; and
    a plurality of non-multiplexers fine elements for providing fine delay.

3. A method for digitally calculating a fractional clock delay and performing real time calibration by controlling the fractional clock delay in a digitally controlled pulse width modulator comprising:
    determining a calibration count value over a specified number of clock cycles by utilizing a counter configured for counting a compared dock wherein the compared clock is a result of the comparison between a generated clock and a system clock;
    selecting a delay length of a plurality of delay elements of a digital delay line by utilizing said calibration count value, wherein said plurality of delay elements comprises upper, lower and fine delays and built with upper and lower delay multiplexers and a non-multiplexer fine delay element;
    selecting said plurality of delay elements based on selected delay length, wherein a state machine calculator is configured to determine a delay characterization data by running a ring oscillator with different delays; and
    determining said fractional clock delay based on the selected delay length, wherein said fractional delay is employed to generate an output of said digitally controlled pulse width modulator.

4. The system of claim 1, wherein a reset counter is configured to count a system clock to generate a reference time.

* * * * *